United States Patent [19]
Furui et al.

[11] Patent Number: 5,258,094
[45] Date of Patent: Nov. 2, 1993

[54] METHOD FOR PRODUCING MULTILAYER PRINTED WIRING BOARDS

[75] Inventors: Seiji Furui; Ryo Maniwa; Kiminori Ishido; Keisuke Okada, all of Tokyo, Japan

[73] Assignee: NEC Corporation, Tokyo, Japan

[21] Appl. No.: 942,746

[22] Filed: Sep. 9, 1992

[30] Foreign Application Priority Data

Sep. 18, 1991 [JP] Japan .................................. 3-237538

[51] Int. Cl.⁵ .......................... B44C 1/22; C23F 1/00; B29C 37/00
[52] U.S. Cl. ...................... 156/634; 29/852; 156/644; 156/645; 156/656; 156/659.1; 156/668; 156/902; 427/97; 430/313; 430/317; 430/318
[58] Field of Search ............... 156/629, 633, 634, 645, 156/644, 656, 659.1, 668, 901, 902; 29/846, 852; 430/313, 317, 318; 427/96, 97, 98; 428/209, 901

[56] References Cited
FOREIGN PATENT DOCUMENTS
0137499 6/1988 Japan .

Primary Examiner—William A. Powell
Attorney, Agent, or Firm—Laff, Whitesel, Conte & Saret

[57] ABSTRACT

A multilayered board is formed by applying a photosensitive insulating resin layer on a laminated plate on which via holes and a circuit pattern are formed, followed by the formation of photoviaholes through the photoprinting method, plating and etching. Then, the multilayered board is adhered to another multilayered board prepared in the same manner through a prepreg layer and a conductive paste while applying heat and pressure to give a multilayer printed wiring board. According to this method, electrical connections between the conductive layer of the upper-most layer and the inner conductive layers, between the inner conductive layers, and between the lower-most conductive layer and the inner conductive layers can be achieved through the photoviaholes and the conductive paste. Therefore, it is not necessary to form through-holes for the electrical connection therebetween. The multilayer printed wiring boards can be substantially improved in the number of layers and wiring density thereof.

6 Claims, 15 Drawing Sheets

METHOD FOR PRODUCING MULTILAYER PRINTED WIRING BOARDS

BACKGROUND OF THE INVENTION

1. Field of the Invention

The present invention relates to a method for producing a multilayer printed wiring board and more particularly to a method for producing a multilayer printed wiring board whose degree of lamination and wiring density can substantially be improved.

2. Description of the Prior Art

In the conventional printed wiring boards, a conductive layer has in general been formed on the inner walls of holes for packaging parts and through-holes (hereinafter referred to as "via holes") by plating the packaging holes and via holes.

In addition, the conventional multilayer printed wiring board has been designed such that embedded through-holes (hereinafter referred to as "inner via holes") are formed within a part of inner layers as the degree of lamination of the multilayer printed wiring boards has become increasingly high.

Incidentally, the development of, for instance, IC's and LSI's of high integration, packaging density and speeding up thereof have recently been advanced with great strides and correspondingly, it has strongly been desired for an increase in the wiring density of the printed wiring board for packaging these devices.

As a method for increasing the wiring density of the printed wiring board, Japanese Patent Public Disclosure No. Sho 63-137499 (Application No. Sho 61-284629) discloses a method of producing a multilayer printed wiring board. This method will be detailed below with reference to the accompanying drawings. FIGS. 1 to 8 are schematic diagrams for explaining the process for producing a multilayer printed wiring board according to the method of this prior art.

Referring now to FIGS. 1 to 8, completed multilayer printed wiring board of this type has a structure comprising six conductive layers as shown in FIG. 8 and can be produced in the following manner.

(1) Via holes 41 (FIG. 1B) are formed through a plate 10

(1) Via holes 41 (FIG. 1B) are formed through a plate 10 (FIG. 1A) whose upper and lower faces are laminated with copper foil layers 21 and 22 respectively (hereinafter referred to as "copper-laminated plate") and then conductive layers 61 and 62 are formed through plating as shown in FIG. 1C.

(2) Circuit patterns are formed on the conductive layer 62 and the copper foil layer 22 according to the known tenting method which makes use of a photosensitive dry film resist 7 as shown in FIGS. 2A and 2B.

(3) The via holes 41 are filled with an epoxy resin 8, followed by drying and hardening the epoxy resin to give a multilayer plate 11 for 1·2 layers (see FIG. 3).

(4) As shown in FIG. 4, a multilayer plate 13 for 5·6 layers is prepared according to the same processes used above. Separately, a multilayer plate 12 for 3·4 layers, on which only conductive patterns are formed, is likewise prepared. Thereafter, these two multilayer plates 12 and 13 and the multilayer plate 11 for the 1·2 layers previously prepared are assembled through prepreg layers 51 and the resulting assembly is integrally formed by applying heat and pressure to give a multilayered board 1 shown in FIG. 4.

(5) Through-holes 3 for inserting parts, for electrically connecting patterns of the inner layers or for electrically connecting the upper face to the lower face are formed in the multilayered board 1 by a drill (FIG. 5) and then the assembly is plated to form a conductive layer 60 on the upper and lower faces and the inner walls of the through-holes (see FIG. 6).

(6) Desired circuit patterns are formed through the conductive layers 60 and 61 and the copper foil layer 21 on the upper-most layer and through the conductive layers 60 and 66 and the copper foil layer 26 on the lower-most layer according to the tenting method which makes use of a photosensitive dry film resist 7 as shown in FIGS. 7 and 8 to give a desired multilayer printed wiring board.

In the conventional multilayer printed wiring board discussed above, it is necessary to form electrical connection between the upper most layer and the inner layers of the multilayered board 1 or between the upper most layer and the lower most layer thereof. To this end, the through-holes 3 must be formed in the multilayered board 1 by a drill and then a conductive layer must be formed within the holes after the board having a multilayer structure is formed. For this reason, the circuit patterns for a third copper foil layer 23 and a fourth copper foil layer 24 in the inner multilayer plate 12 must be designed so that the patterns do not cross the portions at which the through-holes 3 are subsequently formed and accordingly, it is not always easy to provide a multilayer printed wiring board having high wiring density.

SUMMARY OF THE INVENTION

Accordingly, an object of the present invention is to provide a method for producing a multilayer printed wiring board which can eliminate the foregoing problems associated with the conventional techniques and makes it possible to provide a multilayer printed wiring board having a substantially high wiring density.

The method for producing a multilayer printed wiring board according to the present invention comprises the steps of:

(a) applying and forming an etching resist film in a desired pattern on a desired position on a conductive layer;

(b) etching the conductive layer through the etching resist film serving as a mask to form a wiring pattern;

(c) applying a photosensitive insulating resin on the upper face of the etched conductive layer;

(d) photopolymerizing desired portions of the resulting photosensitive insulating resin layer;

(e) removing the portions of the photosensitive insulating resin layer free of photopolymerization to expose the conductive portion on the etched conductive layer and to form photoviaholes;

(f) hardening the photopolymerized portion of the photosensitive insulating resin layer by a method which comprises at least the step of either heating or irradiating with ultraviolet rays;

(g) plating the surface of the hardened photosensitive insulating resin layer to form a conductive layer;

(h) repeating a series of the foregoing steps to form a multilayered board and then printing a desired pattern on the multilayered board with a conductive paste; and (i) adhering, under heat and pressure, at least two multilayered boards through a prepreg layer in which clearances are formed at positions corresponding to the printed pattern of the conductive paste.

DESCRIPTION OF THE PREFERRED EMBODIMENTS

The method of producing a multilayer printed wiring board according to the present invention will hereinafter be explained in more detail with reference to the accompanying drawings.

Figure 17:
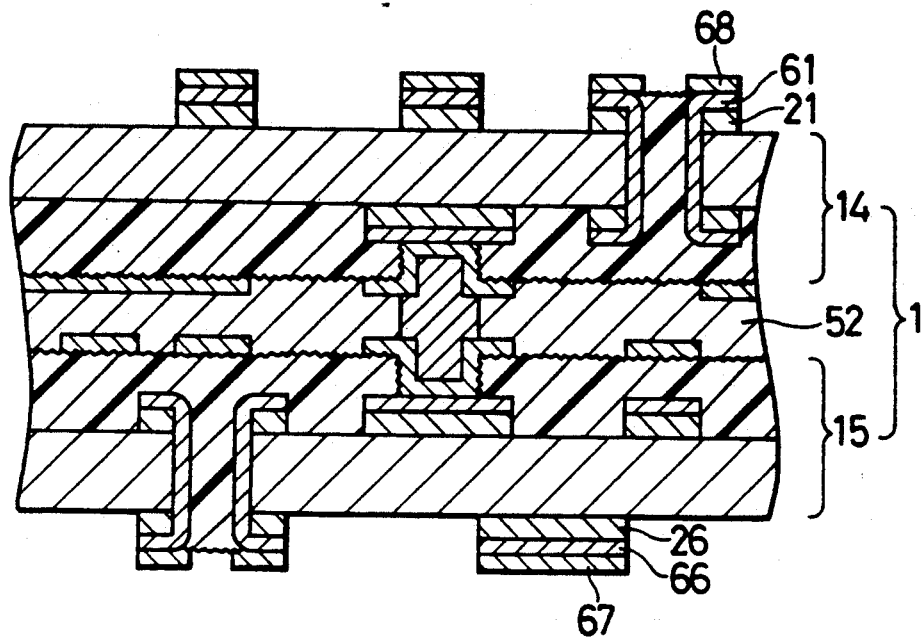
FIG. 17 is a sectional view showing the structure of the completed multilayer printed wiring board of the first embodiment according to the present invention.

FIGS. 9 to 17 show processes for producing a multilayer printed wiring board according to a first embodiment of the present invention. The completed multilayer printed wiring board has a structure comprising six conductive layers as shown in FIG. 17.

According to this embodiment, a multilayer wiring board is produced as follows.

Figure 1A:
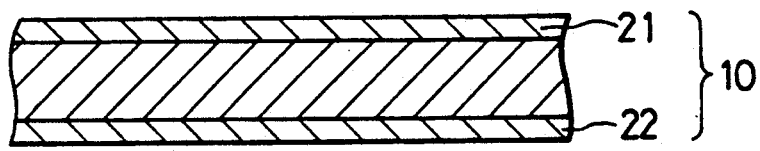
FIGS. 1A to 1C are schematic diagrams for explaining processes of a method for producing a conventional multilayer printed wiring board.
Figure 1B:
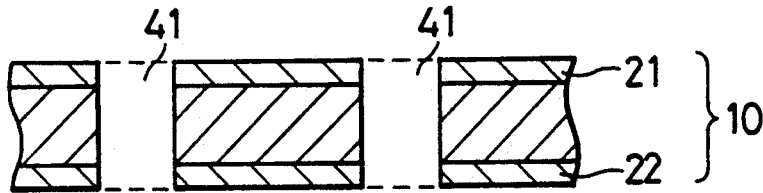
Figure 1C:
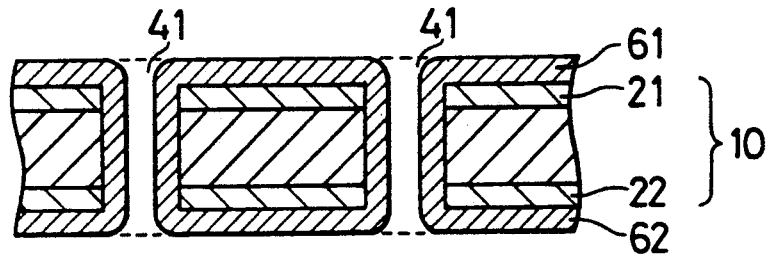
Figure 2A:
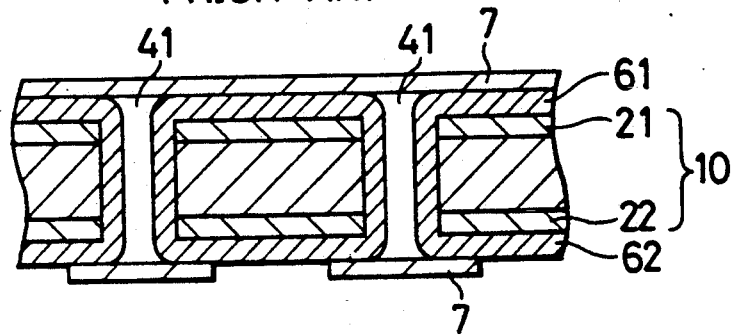
FIGS. 2A to 2B are schematic diagrams for explaining processes, performed subsequent to the process shown in FIG. 1C, of the method for producing the conventional multilayer printed wiring board.
Figure 2B:
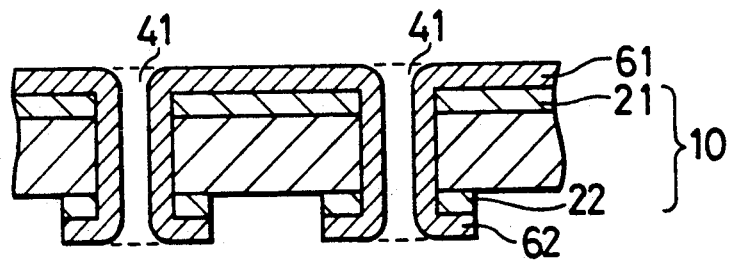
Figure 3:
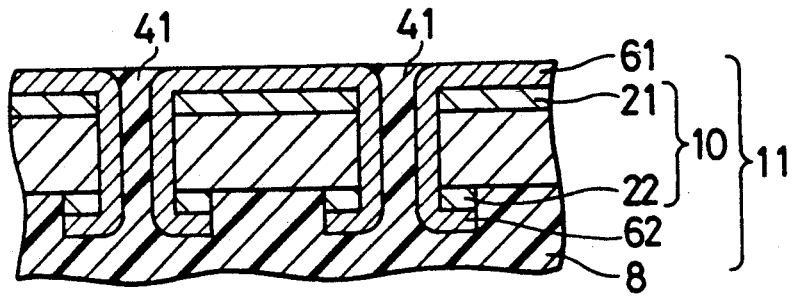
FIG. 3 is a schematic diagram for explaining a process, performed subsequent to the process shown in FIG. 2B, of the method for producing the conventional multilayer printed wiring board.
Figure 4:
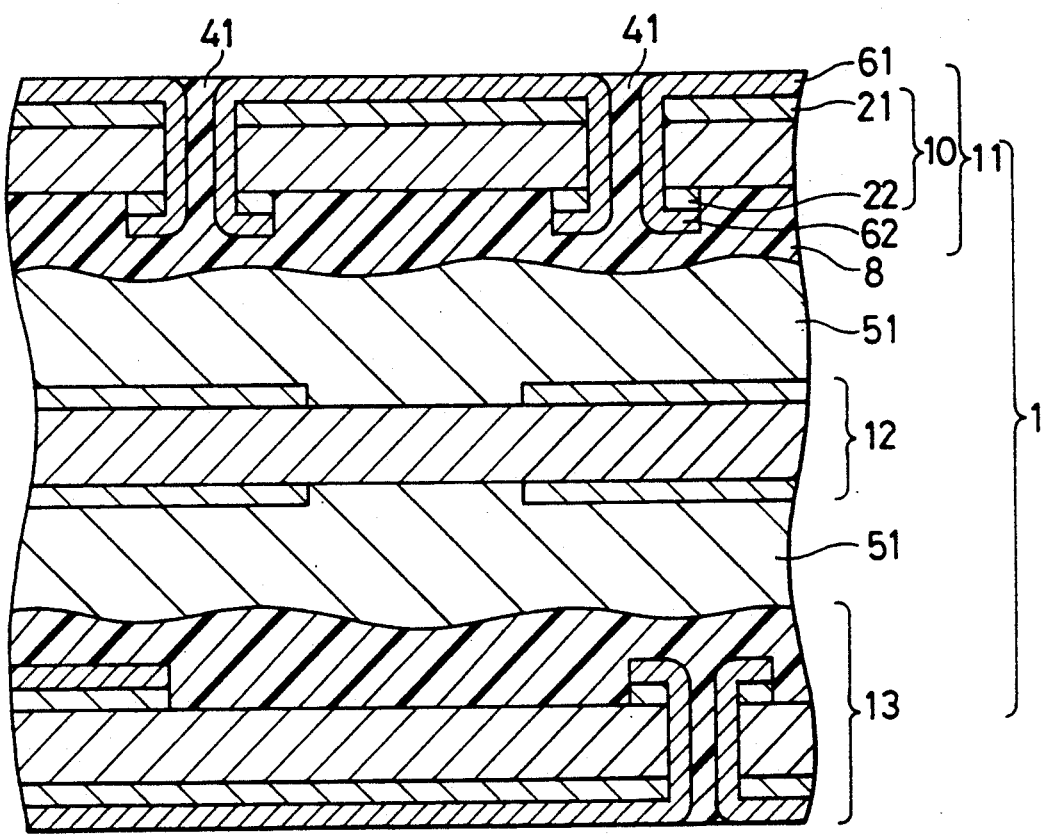
FIG. 4 is a schematic diagram for explaining a process, performed subsequent to the process shown in FIG. 3, of the method for producing the conventional multilayer printed wiring board.
Figure 5:
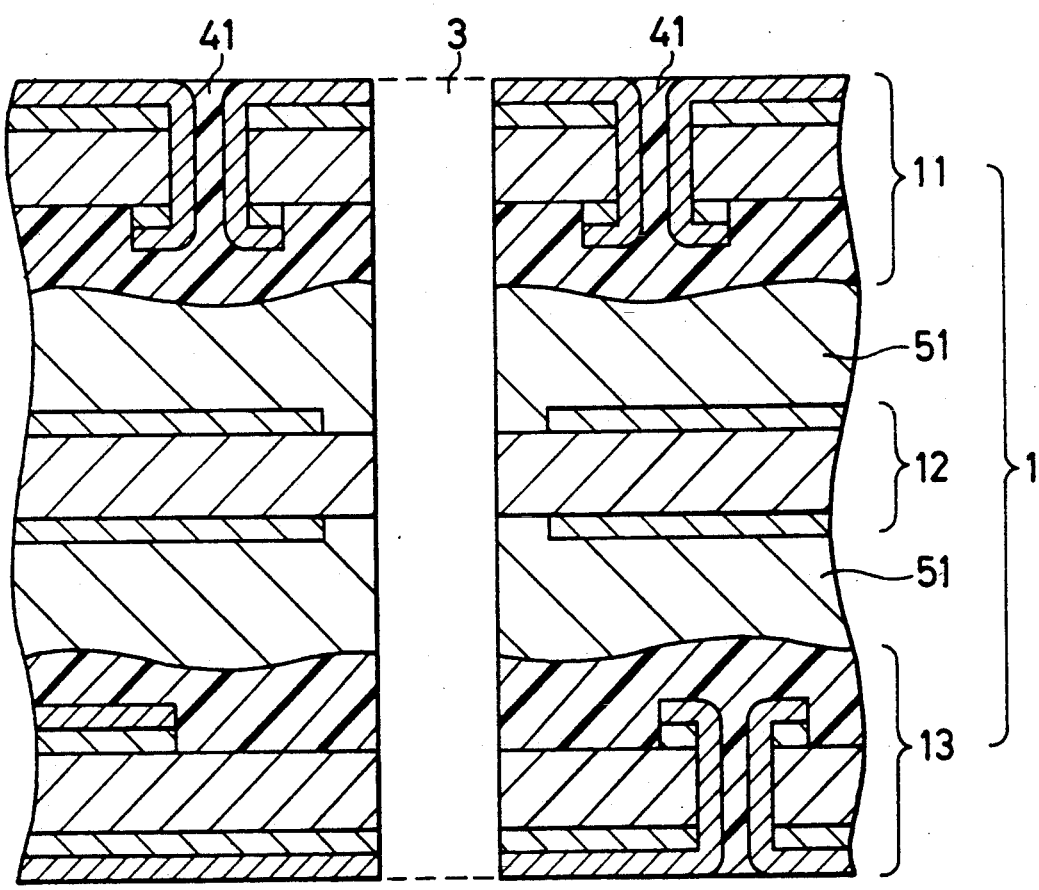
FIG. 5 is a schematic diagram for explaining a process, performed subsequent to the process shown in FIG. 4, of the method for producing the conventional multilayer printed wiring board.
Figure 6:
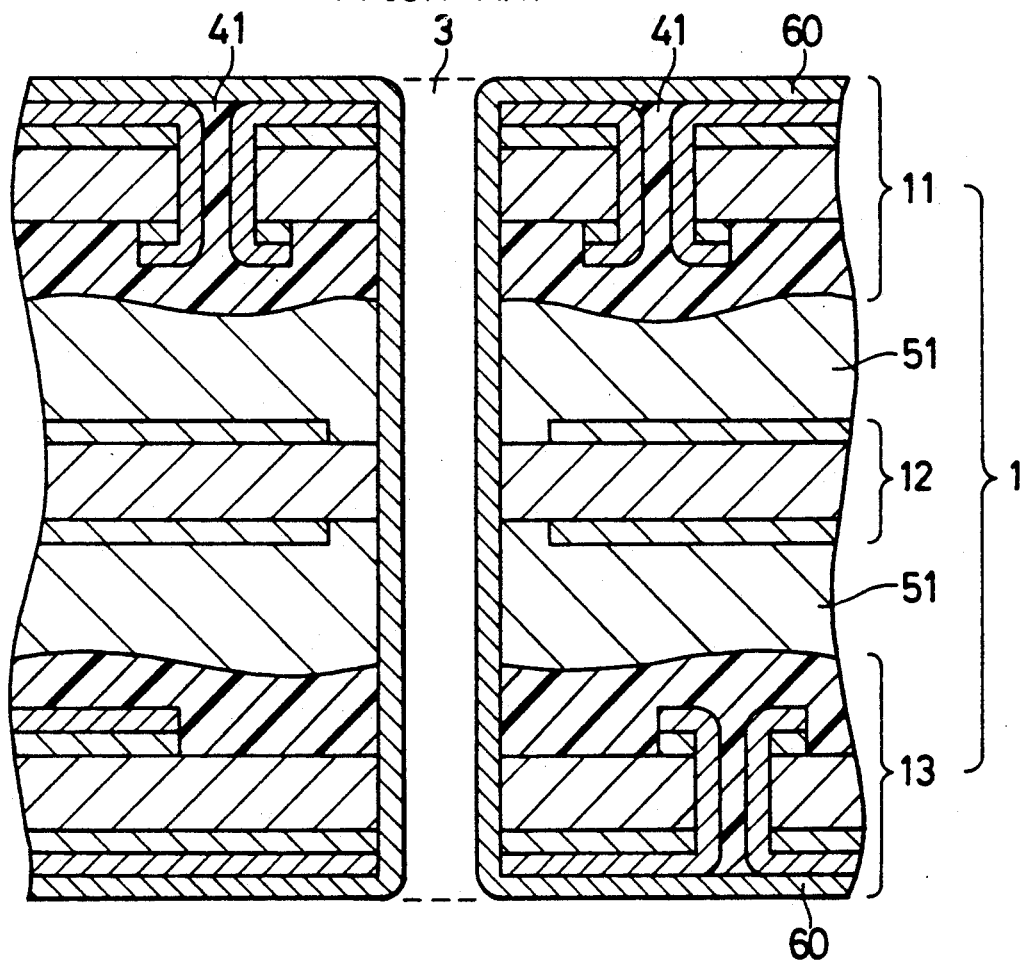
FIG. 6 is a schematic diagram for explaining a process, performed subsequent to the process shown in FIG. 5, of the method for producing the conventional multilayer printed wiring board.
Figure 7:
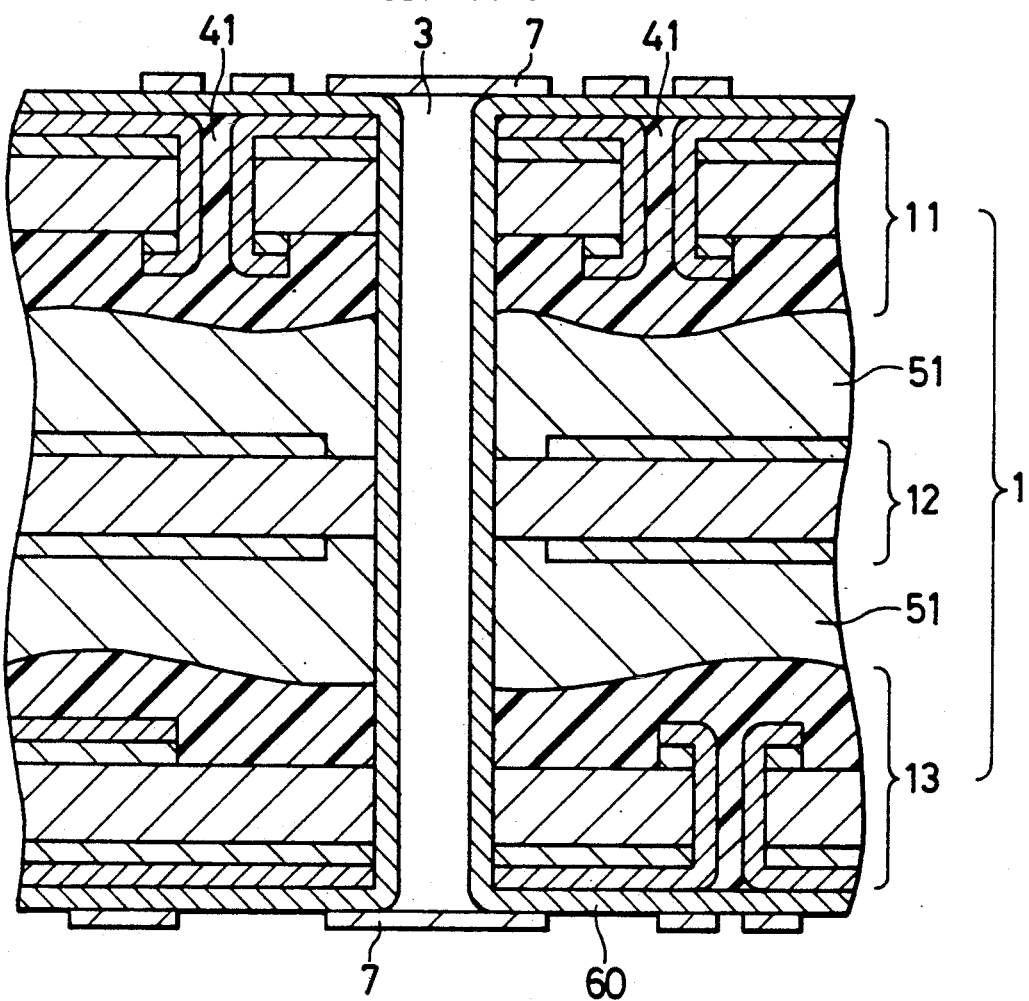
FIG. 7 is a schematic diagram for explaining a process, performed subsequent to the process shown in FIG. 6, of the method for producing the conventional multilayer printed wiring board.
Figure 8:
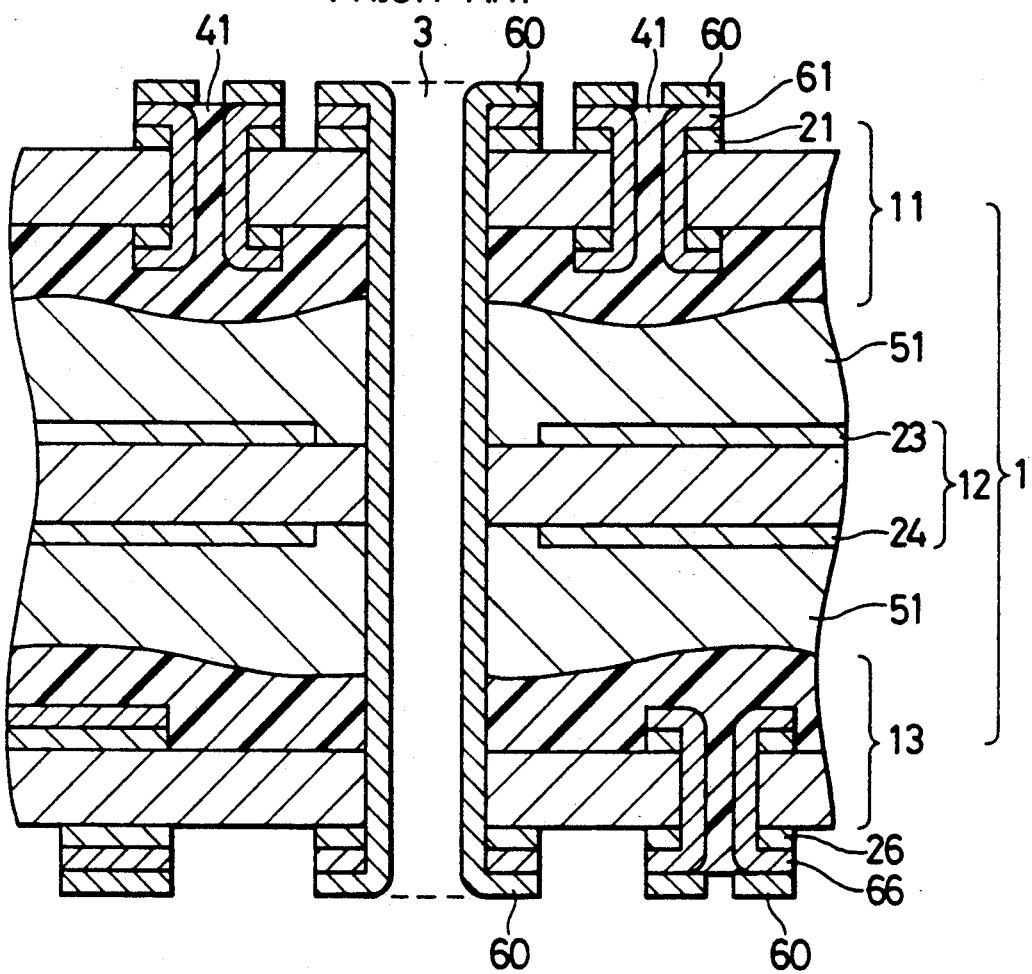
FIG. 8 is a sectional view showing the structure of the multilayer printed wiring board completed according to the conventional method.
Figure 9A:
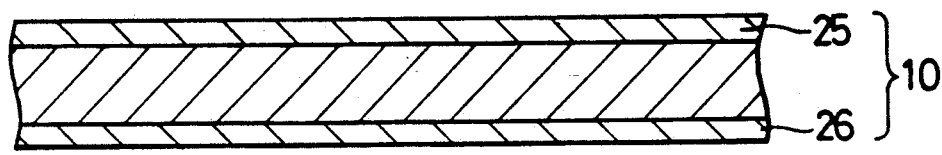
FIGS. 9A to 9C are schematic diagrams for explaining processes of a first embodiment of the method for producing a multilayer printed wiring board according to the present invention.

(1) A copper-laminated plate 10 having a thickness of from 0.1 mm to 1.6 mm and serving as a base for a multilayered board is prepared (see FIG. 9A). Copper-laminated plate 10 is provided, on both upper and lower faces, with copper foil layers 25 and 26 whose thickness ranges from 12 $\mu$m to 35 $\mu$m and on which conductive patterns for 5th and 6th layers are subsequently formed.

Figure 9B:
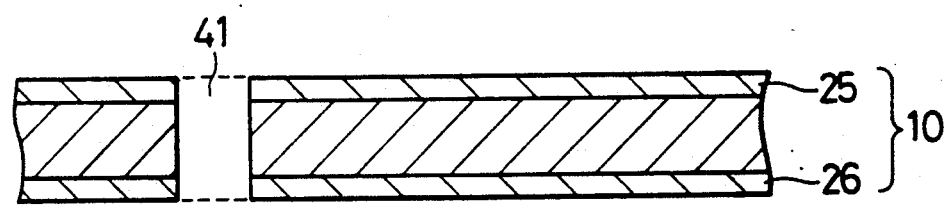

(2) Via holes 41 having a diameter ranging from 0.05 mm to 0.1 mm are formed through the copper-laminated plate 10 by a drill as shown in FIG. 9B.

Figure 9C:
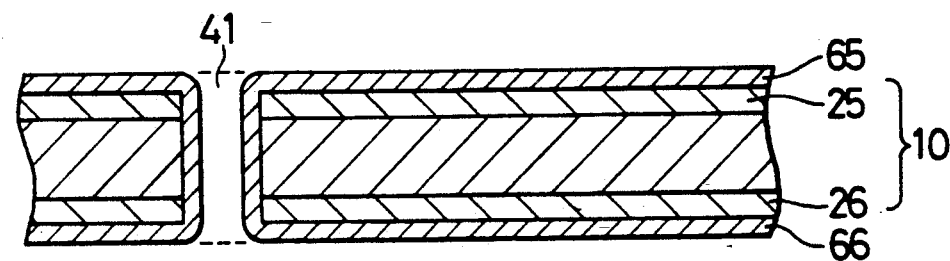

(3) Conductive layers 65 and 66 of, for instance, copper are formed on the entire surface of the copper-laminated plate 10 including the via holes 41 in a thickness of from 12$\mu$m to 18 $\mu$m by the known electroless plating and electroplating methods to electrically connect the 5th copper foil layer 25 and the 6th copper foil layer 26 of the copper-laminated plate 10 (FIG. 9C).

Figure 10A:
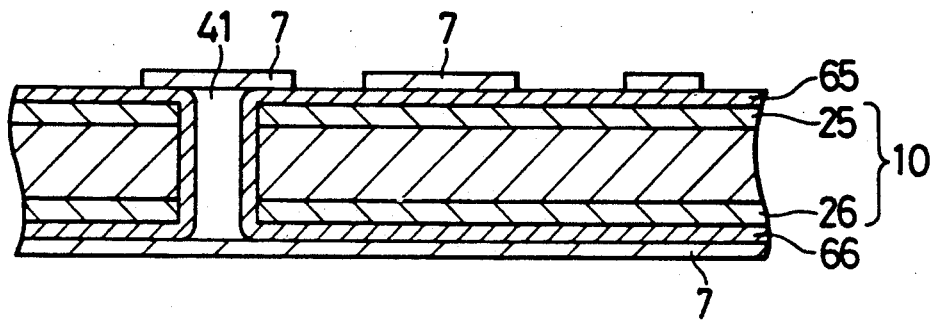
FIGS. 10A to 10C are schematic diagrams for explaining processes, performed subsequent to the process shown in FIG. 9C, of the first embodiment of the method for producing a multilayer printed wiring board according to the present invention.
Figure 10B:
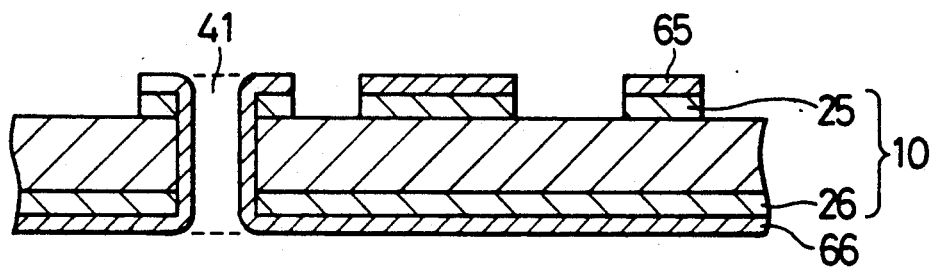

(4) The entire surface of the 6th conductive layer 66 and desired portions for forming circuit patterns on the 5th conductive layer 65 are covered with a photosensitive dry film resist 7 (FIG. 10A), for instance, RISTON (trade mark) dry film TM 1220 (solvent type) or TM 4220 (aqueous type) available from Dupont Company (25 $\mu$m to 50 $\mu$m in thickness) according to the known tenting method, followed by development with a developer such as 1,1,1-trichloroethane (for solvent type) or sodium carbonate (for aqueous type), etching and peeling off or delaminating of the resist to form circuit patterns on the 5th conductive layer 65 and copper foil layer 25 (FIG. 10B).

Figure 10C:
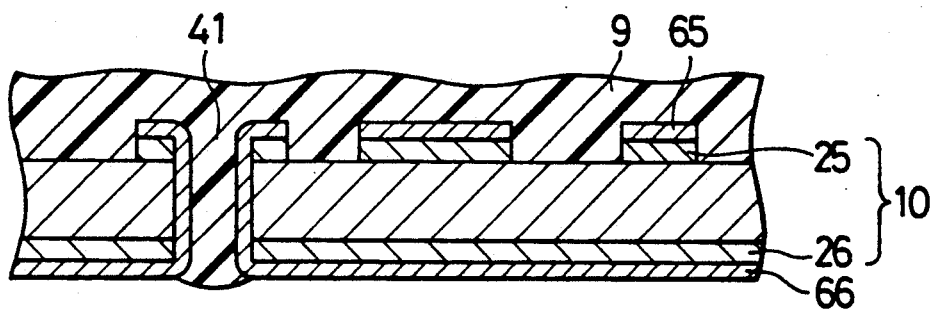

(5) A photosensitive insulating resin 9 of, for instance, Probimer (trade mark) TM 52 available from CIBA GEIGY Company in a thickness ranging from 40 $\mu$m to 80 $\mu$m is applied onto the entire surface including the 5th conductive layer 65 on which the circuit pattern has been formed, according to a screen printing method (FIG. 10C).

Figure 11A:
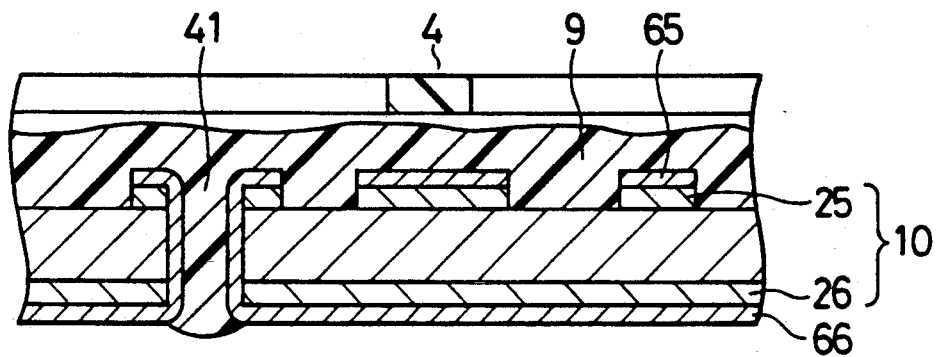
FIGS. 11A and 11B are schematic diagrams for explaining processes, performed subsequent to the process shown in FIG. 10C, of the first embodiment of the method for producing a multilayer printed wiring board according to the present invention.

(6) A mask film 4 is closely adhered to the resulting photosensitive insulating resin layer 9 and the insulating resin layer is exposed to ultraviolet rays to thus photopolymerize the desired portion thereof (FIG. 11A).

Figure 11B:
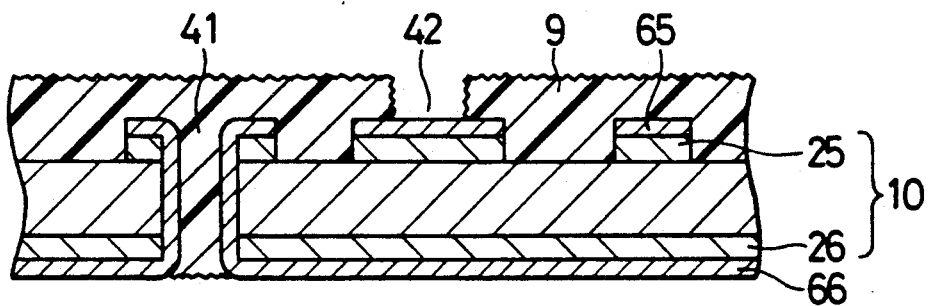

(7) The portions of the photosensitive insulating resin layer free of photopolymerization are removed by development with sodium carbonate to form photoviaholes 42, then the remaining photosensitives insulating resin layer 9 is hardened by heating and irradiating with ultraviolet rays and the hardened photosensitive insulating resin layer is subjected to surface-roughening treatment by mechanical and chemical graining (FIG. 11B). The surface of the photosensitive insulating resin layer 9 is thus roughened for improving the adhesion of the photosensitive insulating resin layer 9 to a conductive layer subsequently plated thereon.

Figure 12A:
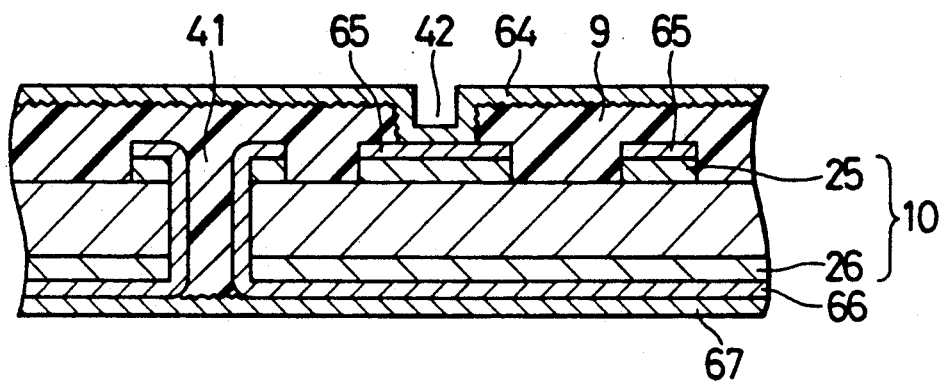
FIGS. 12A and 12B are schematic diagrams for explaining processes, performed subsequent to the process shown in FIG. 11B, of the first embodiment of the method for producing a multilayer printed wiring board according to the present invention.
Figure 12B:
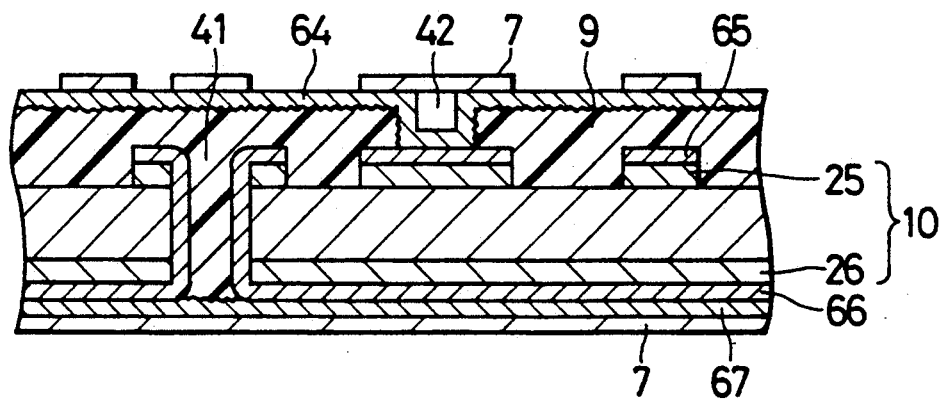

(8) Then a 4th conductive layer 64 and a lower-most conductive layer 67 of copper are formed on the entire surface of the plate including photoviaholes 42 in thickness ranging from 12 μm to 18 μm by the known electroless plating and electroplating methods to thus connect the 5th conductive layer 65 and the 4th conductive layer 64 (FIG. 12A).

Figure 13A:
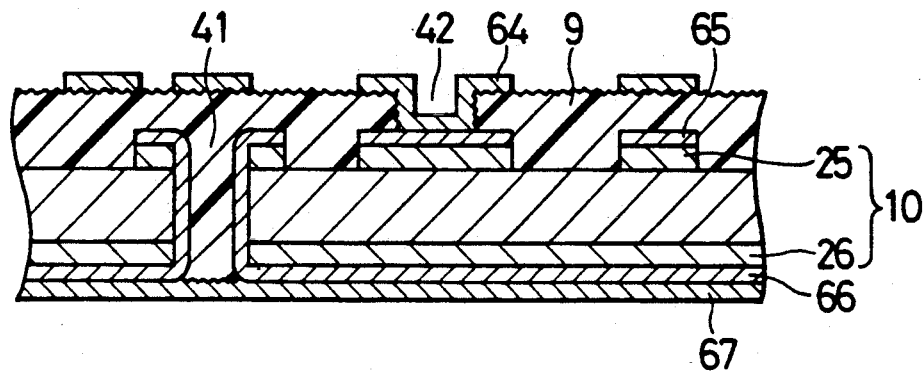
FIGS. 13A and 13B are schematic diagrams for explaining processes, performed subsequent to the process shown in FIG. 12B, of the first embodiment of the method for producing a multilayer printed wiring board according to the present invention.

(9) The entire surface of the lower-most conductive layer 67 and desired portions on the 4th conductive layer 64 for subsequently forming circuit patterns are covered with a photosensitive dry film resist 7 (FIG. 12B) in a thickness ranging from 25 μm to 50 μm according to the known tenting method, followed by development, etching and peeling off or delaminating of the resist to form circuit patterns on the 4th conductive layer 64 (FIG. 13A).

Figure 13B:
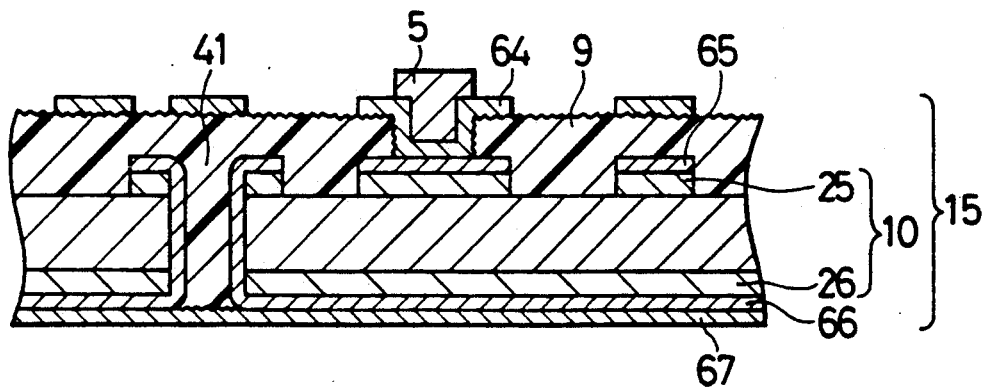

(10) A conductive paste 5 such as eutectic solder (of 50 μm to 100 μm in thickness) is applied onto the photoviaholes 42 on the 4th conductive layer 64 through a metal mask to give a multilayered board 15 (FIG. 13B).

(11) Another multilayered board 14 is separately prepared by repeating a series of the foregoing processes. In the multilayered board 14, desired circuit patterns are formed on a 2nd copper foil layer 22, a 2nd conductive layer 62 and 3rd conductive layer 63 (FIG. 14).

Figure 14:
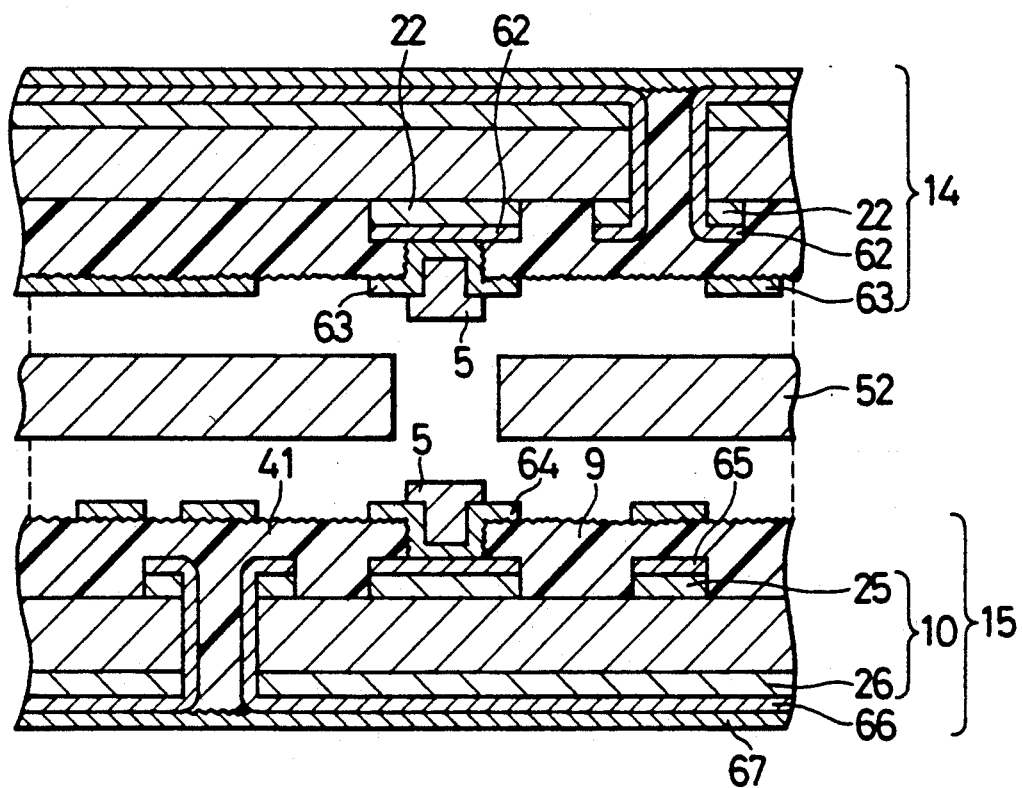
FIG. 14 is a schematic diagram for explaining a process, performed subsequent to the process shown in FIG. 13B, of the first embodiment of the method for producing a multilayer printed wiring board according to the present invention.
Figure 15:
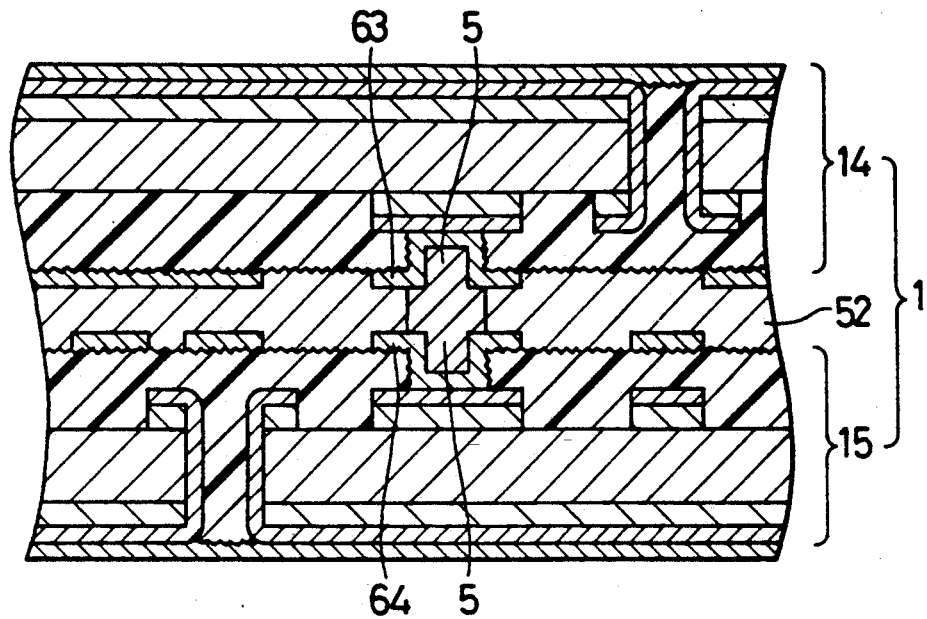
FIG. 15 is a schematic diagram for explaining a process, performed subsequent to the process shown in FIG. 14, of the first embodiment of the method for producing a multilayer printed wiring board according to the present invention.
Figure 16:
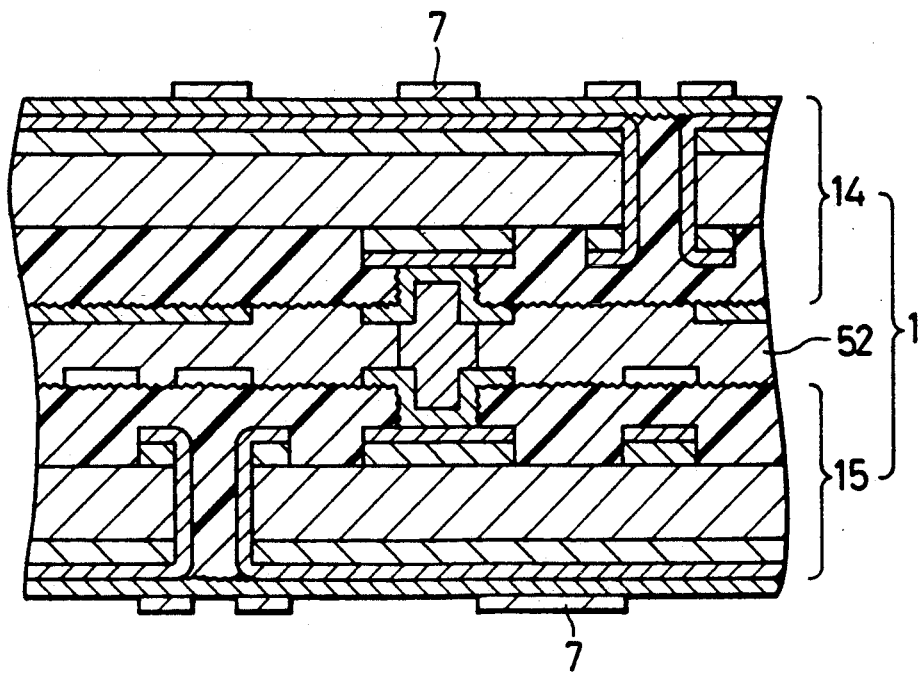
FIG. 16 is a schematic diagram for explaining a process, performed subsequent to the process shown in FIG. 15, of the first embodiment of the method for producing a multilayer printed wiring board according to the present invention.

(12) As shown in FIG. 14, the multilayered boards 14 and 15 are assembled through a prepreg layer 52 of epoxide resine or imide resine in which clearances are formed at positions corresponding to the pattern of the conductive paste 5 and then heat and pressure are applied thereto to give an integrally formed multilayered board 1 (FIG. 15). At this stage, the conductive paste 5 is converted into a conductor and the 3rd conductive layer 63 on the multilayered board 14 is electrically connected to the 4th conductive layer 64 on the multilayered board 15.

(13) Finally, desired portions on the upper-most and lower-most layers on which circuit patterns are subsequently formed are covered with a photosensitive dry film resist 7 (FIG. 16), followed by the removal of unnecessary portions of conductive layers 67 and 68, those 66 and 61 of the underlying layers and the copper foil layers 26 and 21 through etching with cupric chloride etchant, ferric chloride etchant or alkaline etchant to give an intended multilayer printed wiring board according to this embodiment (FIG. 17).

Figure 18:
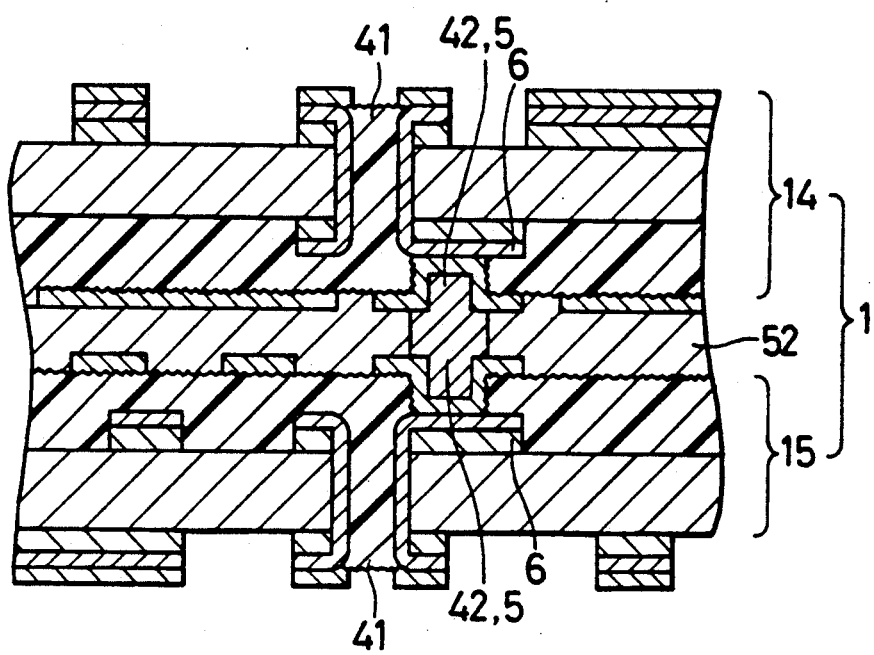
FIG. 18 is a sectional view showing the structure of a completed multilayer printed wiring board of a second embodiment according to the present invention.

A second embodiment of the present invention will now be explained in detail below. FIG. 18 is a sectional view showing the structure of a completed multilayer printed wiring board according to the second embodiment. Referring to FIG. 18, the structure of the second embodiment is almost identical with that of the first embodiment except that conductive layers on the upper-most nd lower-most layers are electrically connected to one another through via holes 41, photoviaholes 42 and conductive paste layer 5. The multilayer printed wiring board of this embodiment can be produced as follows.

(1) Photoviaholes 42 are formed on lands 6 of via holes 41 in the similar manner used in the first embodiment to give a multilayered board 15. Then a conductive paste 5 is applied onto positions corresponding to photoviaholes 42.

(2) Another multilayered board 14 is separately prepared in the similar manner used in the above (1).

(3) Multilayered boards 14 and 15 are assembled through a prepeg layer 52, firmly adhered to one another through application of heat and pressure and the upper-most and lower-most layers are electrically connected to complete a multilayer printed wiring board of the second embodiment.

As has been discussed above in detail, in the method of the present invention, electrical connections between the conductive layer of the upper-most layer and the inner conductive layers, between the inner conductive layers and between the lower-most conductive layer and the inner conductive layers can be achieved through the use of photoviaholes and a conductive paste. Therefore, it is not necessary to form throughholes for the electrical connection therebetween. Thus, the present invention makes it possible to increase the degree of freedom in designing the arrangement of the circuit patterns for the inner conductive layers and accordingly multilayer printed wiring boards can be substantially improved in the degree of lamination and wiring density as compared with the conventional multilayer printed wiring boards.

What is claimed is:

1. A method for producing a multilayer printed wiring board comprising the steps of:
   (a) applying and forming an etching resist film in a desired pattern on a desired position on a conductive layer;
   (b) etching said conductive layer through said etching resist film serving as a mask to form a wiring a pattern;
   (c) applying a photosensitive insulating resin on the upper face of the etched conductive layer;
   (d) photopolymerizing desired portions of the resulting photosensitive insulating resin layer;
   (e) removing the portions of the photosensitive insulating resin layer free of photopolymerization to expose the conductive portion on said etched conductive layer and to form photoviaholes;
   (f) hardening the photopolymerized portion of said photosensitive insulating resin layer by a method which comprises at least the step of either heating or irradiating with ultraviolet rays;
   (g) plating the surface of the hardened photosensitive insulating resin layer to form a conductive layer;
   (h) repeating a series of the foregoing steps to form a multilayered board and then printing a desired pattern on said multilayered board with a conductive paste; and
   (i) adhering, under heat and pressure, at least two said multilayered boards through a prepeg layer in which clearances are formed at positions corresponding to the printed pattern of said conductive paste.

2. The method of claim 1 wherein said resin layer hardened in the step (f) is then subjected to a surface-roughening treatment.

3. The method of claim 2 wherein said surface-roughening treatment is a mechanical or chemical surface-graining treatment.

4. The method of claim 1 wherein said etching is carried out by a tenting method.

5. A method for producing a multilayer printed wiring board which comprises six conductive layers comprising the steps of;

(1) preparing a copper-laminated plate serving as a base for a multilayered board, said copper-laminated plate being provided, on both upper and lower faces, with copper foil layers on which conductive patterns for 5th and 6th layers are subsequently formed;

(2) forming via holes through said copper-laminated plate by a drill;

(3) forming conductive layers on the entire surface of said copper-laminated plate including said via holes by an electroless plating or electroplating method to electrically connect the 5th copper foil layer and the 6th copper foil layer of said copper-laminated plate;

(4) covering the entire surface of the 6th conductive layer and desired portions for forming circuit patterns on the 5th conductive layer with a photosensitive dry film resist according to a tenting method, followed by development, etching and peeling off of the resist to form circuit patterns on said 5th conductive layer and copper foil layer;

(5) applying a photosensitive insulating resin onto the entire surface including said 5th conductive layer on which the circuit pattern has been formed, according to a screen printing method;

(6) closely adhering a mask film to the resulting photosensitive insulating resin layer and exposing said insulating resin layer to ultraviolet rays to thus photopolymerize the desired portions thereof;

(7) removing the portions of the photosensitive insulating resin layer free of photopolymerization by development to form photoviaholes, then hardening the remaining photosensitive insulating resin layer by heating and irradiating with ultraviolet rays and surface-roughening the hardened photosensitive insulating resin layer by mechanical or chemical graining;

(8) then forming a 4th conductive layer and a lower-most conductive layer on the entire surface of the plate including said photoviaholes by an electroless plating or electroplating method to thus connect said 5th conductive layer and said 4th conductive layer;

(9) covering the entire surface of the lower-most conductive layer and desired portions on said 4th conductive layer for subsequently forming circuit patterns with a photosensitive dry film resist according to a tenting method, followed by development, etching and peeling off of the resist to form circuit patterns on said 4th conductive layer;

(10) applying a conductive paste onto said photoviaholes on said 4th conductive layer through a metal mask to give a first multilayered board;

(11) separately preparing a second multilayered board by repeating a series of the foregoing processes, in this second multilayered board, desired circuit patterns being formed on a 2nd copper foil layer, a 2nd conductive layer and a 3rd conductive layer;

(12) assembling said first and second multilayered boards through a prepreg layer in which clearances are formed at positions corresponding to the pattern of said conductive paste and then applying heat and pressure thereto to give an integrally formed multilayered board, at this stage, said conductive paste being converted into a conductor and said 3rd conductive layer on said second multilayered board being electrically connected to said 4th conductive layer on said first multilayered board; and

(13) covering desired portions on the upper-most and lower-most layers on which circuit patterns are subsequently formed with a photosensitive dry film resist, followed by the removal of unnecessary portions of the conductive layers, those of the underlying layers and the copper foil layers through etching to give an intended multilayer printed wiring board.

6. The method of claim 5 wherein said photoviaholes are formed on lands of said holes, whereby said upon-most and lower-most conductive layers are electrically connected to one another through said via holes, photoviaholes and conductive paste.

* * * * *